US012342509B1

(12) United States Patent
Kom

(10) Patent No.: US 12,342,509 B1
(45) Date of Patent: Jun. 24, 2025

(54) ENVIRONMENT-BASED TUNING FOR COMPUTING DEVICES

(71) Applicant: Core Scientific, Inc., Bellevue, WA (US)

(72) Inventor: Lawrence Kom, Redmond, WA (US)

(73) Assignee: Core Scientific, Inc., Austin, TX (US)

( * ) Notice: Subject to any disclaimer, the term of this patent is extended or adjusted under 35 U.S.C. 154(b) by 919 days.

(21) Appl. No.: 17/476,766

(22) Filed: Sep. 16, 2021

Related U.S. Application Data

(60) Provisional application No. 63/079,169, filed on Sep. 16, 2020.

(51) Int. Cl.
| | |
|---|---|
| H05K 7/20 | (2006.01) |
| F24F 11/00 | (2018.01) |
| G01W 1/02 | (2006.01) |
| G01W 1/10 | (2006.01) |
| H05K 5/02 | (2006.01) |

(52) U.S. Cl.
CPC .......... H05K 7/20836 (2013.01); G01W 1/02 (2013.01); G01W 1/10 (2013.01); H05K 5/0213 (2013.01); H05K 7/20209 (2013.01)

(58) Field of Classification Search
CPC .............................. H05K 7/20836; F24F 11/00
See application file for complete search history.

(56) References Cited

U.S. PATENT DOCUMENTS

| | | | | |
|---|---|---|---|---|
| 4,248,051 A * | 2/1981 | Darcy | ...................... | G05D 23/24 |
| | | | | 62/115 |
| 10,180,261 B1 * | 1/2019 | Ross | .......................... | F24F 11/30 |
| 10,485,141 B2 * | 11/2019 | Rogers | .................. | H05K 7/1497 |
| 2009/0013703 A1 * | 1/2009 | Werner | .................. | F24F 5/0046 |
| | | | | 62/180 |
| 2014/0177163 A1 * | 6/2014 | Wiley | ................ | H05K 7/20745 |
| | | | | 165/57 |
| 2016/0143181 A1 * | 5/2016 | De Felice | ................ | F24F 11/46 |
| | | | | 700/278 |
| 2016/0187899 A1 * | 6/2016 | Lee | .......................... | F24F 11/77 |
| | | | | 236/44 C |

(Continued)

FOREIGN PATENT DOCUMENTS

DE 102011001158 A1 * 9/2012 ............ F24F 11/001

OTHER PUBLICATIONS

Chen et al, "PTEC: A System for Predictive Thermal and Energy Control in Data Centers", 2014 IEEE Real-Time Systems Symposium, 2014, pp. 218-227, doi: 10.1109/RTSS.2014.27.

*Primary Examiner* — Mark A Connolly
(74) *Attorney, Agent, or Firm* — Fishman Stewart PLLC

(57) ABSTRACT

Systems and methods for managing computing devices in a data center based on collected environmental data are disclosed. Temperature data from the computing devices is periodically gathered along with environmental data from sensors inside and outside the data center. The collected data is used to create a correlation model between the outside environmental data, the inside environmental data, and the device environmental status. Weather data for the geographic location of the data center may also be incorporated into the correlation model, which may be used to predict future heat spikes and trigger preventative measures such as adjusting device fans, operating frequencies, reducing or shifting workloads, adjusting vents, and engaging cooling units.

20 Claims, 4 Drawing Sheets

(56) References Cited

U.S. PATENT DOCUMENTS

| | | | |
|---|---|---|---|
| 2017/0109205 A1* | 4/2017 | Ahuja | G06F 9/5094 |
| 2017/0264493 A1* | 9/2017 | Cencini | H04L 67/12 |
| 2019/0187764 A1* | 6/2019 | VanGilder | G06F 30/13 |
| 2019/0265764 A1* | 8/2019 | Ping | G05B 13/024 |
| 2020/0100394 A1* | 3/2020 | Albinger | F24F 11/47 |
| 2020/0245510 A1* | 7/2020 | LeFebvre | H05K 7/20827 |
| 2020/0379529 A1* | 12/2020 | Le Goff | G06F 1/206 |
| 2021/0003308 A1* | 1/2021 | Venne | G05B 19/042 |
| 2021/0028983 A1 | 1/2021 | Balakrishnan | |

\* cited by examiner

ENVIRONMENT-BASED TUNING FOR COMPUTING DEVICES

CROSS-REFERENCE TO RELATED APPLICATIONS

This application claims the benefit of, and priority to, U.S. Provisional Application Ser. No. 63/079,169, filed Sep. 16, 2020, the disclosure of which is hereby incorporated herein by reference in its entirety and for all purposes.

TECHNICAL FIELD

The present disclosure generally relates to the field of computing and, more particularly, to systems and methods for managing large numbers of computing devices in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Data centers housing large numbers of miners or other CPU- or GPU-based systems used for compute intensive workloads in particular (e.g., rendering, AI, machine learning, data science) may face cooling issues. This is due to the significantly higher density, power usage, heat generation, and duty cycle common to these devices and workloads.

The heat in these data centers can exceed the cooling ability of a computing device's built-in fans, which force air across heat sinks on the computing device in order to extract and exhaust the waste heat. Traditional methods for improving cooling of computing devices in data centers include adding additional large external fans to increase airflow across the computing devices and mixing in refrigerated air to reduce the temperature of the air that is forced across the computing device by its built-in cooling fans. These methods have a significant drawback in that they use significant amounts of energy on top of the energy already used by the computing devices themselves.

For at least these reasons, there is a desire for a solution to allow for improved efficient cooling and thermal management of computing devices in a data center.

SUMMARY

Improved systems and methods for cooling and thermal management of a plurality of computing devices in a data center are contemplated. In one embodiment, the method comprises periodically collecting environmental data from environmental sensors both inside and outside a data center, collecting device temperature data from one or more of the computing devices in the data center, and creating a correlation model between the outside environmental data, the inside environmental data, and the device temperature data. The correlation model may be used to predict future heat spikes and take preventative measures such as modifying one or more operating parameters for the data center and or the computing devices.

The environmental data may comprise, for example, temperature, humidity, barometric pressure, solar radiation, wind direction and wind speed. The correlation model may be periodically updated based on newly collected data. Weather forecast data for the geographical location of the data center may also be gathered and incorporated into the correlation model.

The preventative measures may comprise engaging a cooling unit (e.g., refrigerated air, mister, humidifier), changing the fan speed of one or more of the computing devices, or opening/closing external air vents or dampers in the data center. For example, a first external air intake vent may be closed, and a second external air intake vent on a different side of the data center may be opened, e.g. to take advantage of wind direction and cooler temperatures based on shade patterns. Other examples of preventative measures may comprise reducing the operating frequency or voltage of one or more of the computing devices and adjusting the frequency at which work is dispatched to one or more of the computing devices.

An improved system for managing a data center is also contemplated. The system may comprise a plurality of computing devices, a plurality of sensors located inside and outside the data center, and a management server connected to the plurality of computing devices and sensors via a network. The management server may be configured to execute a management application (e.g., stored on a non-transitory computer-readable storage medium) that creates and updates a correlation model that is used to predict undesirable environmental conditions in the data center (e.g., temperatures outside a desired operating range). In response to a predicted undesirable temperature, the management application may take preventative action, such as temporarily adjusting air vents/dampers (e.g. internal and external), turning on a cooling unit, and changing fan speeds or operating frequencies on the computing devices. For example, the preventative action may comprise closing a first set of vents on a first side of the data center and opening vents a second set of vents on a second side of the data center, adjusting fan speeds for different sets of computing devices based on their location relative to vents, and turning on cooling units. The management application may also temporarily reduce the amount of work sent to one or more subsets of the computing devices.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
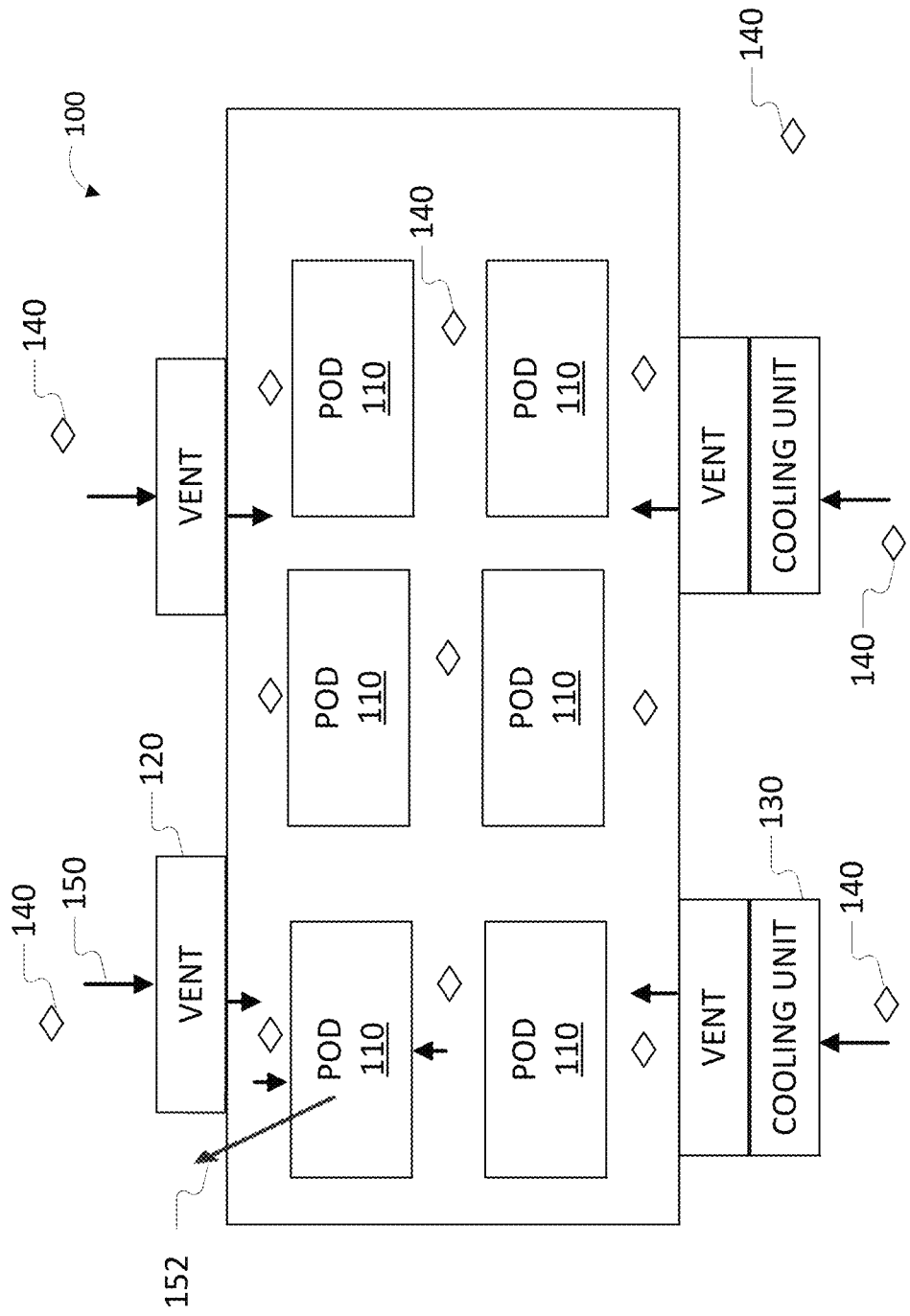
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned above the center of each pod) to capture the hot waste air and then discharge it out of the data center via vents in the roof of the data center.

Cool air is drawn into the data center 100 through vents (e.g., vent 120) indicated by arrow 150. The vents are adjustable (e.g. via dampers or louvers) so that airflow can be controlled (e.g., restricted or blocked) as needed. Once the air is inside data center 100, it is drawn into pods 110 and then expelled out of the data center via an exhaust opening (e.g., out the top and middle of pod 110 as indicated by arrow 152). A number of environmental sensors 140 may be located both inside and outside the data center. These sensors are network-enabled (e.g., wireless) and provide various environmental data such as temperature, humidity, barometric pressure, wind speed, wind direction, and solar radiation levels (e.g., cloudiness). A subset of these sensors may be located inside the data center, for example, in the cold aisles where cold air is drawn into the pods 110. Another subset of the pods may be located outside the data center 100, e.g., on different sides of the data center near each air intake vent. This enables the sensors to record environmental data that may vary on the different sides of the data center. For example, at certain times of the day temperatures on one side of the data center may be higher than temperatures on another side of the data center. This may be due to the angle of the sun striking that area outside the data center, or due to shade from nearby trees or structures. In these cases, it may be beneficial to open the vents on the cooler side of the data center and close the vents on the hotter side of the data center.

Some of the external air vents may have an associated cooling unit 130 that may be turned on as needed to reduce the temperature of the incoming outside air. For example, these may include refrigerated air units or misters or humidifiers that can be turned on during particularly hot days when the outside air is too warm to effectively cool the computing devices in pods 110.

In some embodiments, the volume of air inside data center 100 may be significant (much larger than shown in the figure). In these embodiments, there may be a significant delay in the change in air temperature of the air entering a pod relative to a change in the air temperature entering a vent 120. Depending on the configuration of the data center 100, significant mixing of the internal and external air may occur before being drawn into pod 110. Some data centers may be configured with baffles or adjustable vents and fans to encourage this mixing. By placing a number of environmental sensors 140 in different locations in data center 100, this mixing and progression of air temperatures may be tracked over time.

Figure 2:
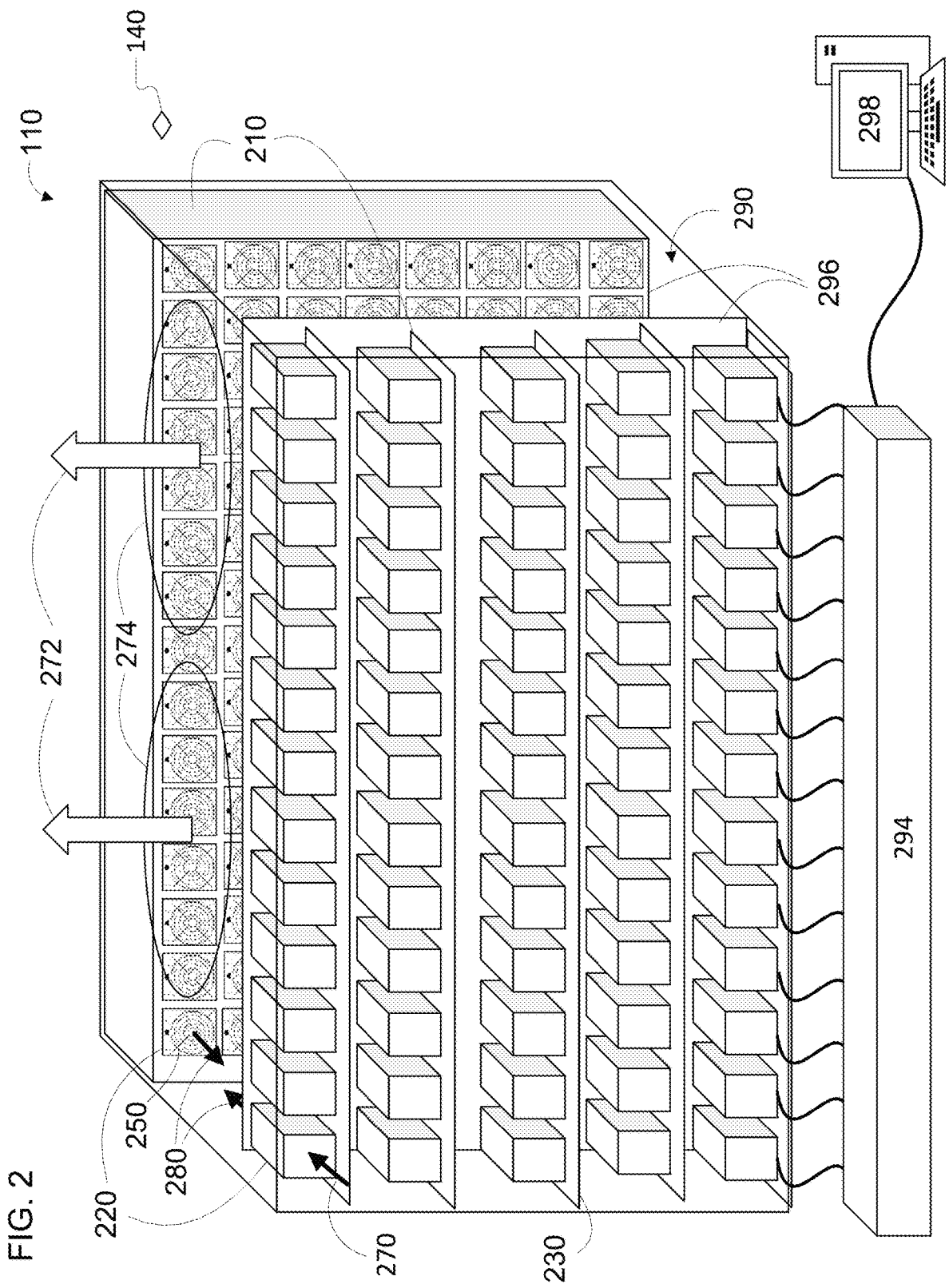
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used in parallel, series or a combination of parallel and series within computing device 220. Heated air is exhausted by computing devices 220 into the space between racks 210, often called a hot aisle 290. The space between racks 210 is typically sealed except for one or more exhaust vents 274 through which the heated air exits. In some embodiments, these openings may be at the side, but more commonly these exhaust openings are located at the top of hot aisle 290 with the heated air exiting above the pod as indicated by arrows 272. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents 274.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information provided from one or more temperature sensors on each computing device) and results of the computing jobs to be returned. Switch 294 may also be connected to other networks such as the internet, as well as a management server 298 that is configured to execute a management application to manage computing devices 220. Management server 298 may be a traditional PC, a server (bare metal or virtual) or a specialized appliance. Management server 298 may be configured with one or more processors, volatile memory and non-volatile memory such as flash storage or internal or external hard disk (e.g., network attached storage). The management application is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management server 298 as a stand-alone software package, partly on the management server 298 and partly on a remote computer or computing devices 220, or entirely on a remote computer or computing devices 220.

While different computing devices 220 will have different interfaces for setting fan speed, one example is that the computing device will have a network port open that will accept management commands such as setting the fan speed, voltage level, operating frequency, etc. In order to better cool computing devices 220, the management application may be configured to create a correlation model of external and internal environmental data, and device temperature data, and based on that model predict future undesirable temperature spikes. Based on those predictions, preventative measures may be implemented by the management application, e.g., sending instructions that cause computing devices 220 to temporarily increase their fan speeds, or reduce their operating frequencies (to reduce heat generated). The management application may also reduce the amount of work dispatched to some of the computing devices that are likely to experience higher temperatures (e.g., idling them or reducing their duty cycle to reduce heat generated).

The management application may also provide a user interface for users to configure and control computing devices 220. For example, the management application may be configured to permit the user to specify device configuration settings (e.g., maximum and minimum desired temperatures, voltages, operating frequencies and fan speeds).

With this information the management application may then monitor the status (e.g., device temperature, fan speed, operating frequency and voltage) of each computing device associate that data with the device's location in the data center. This data can then be used to populate a model of the environment in the data center.

In addition to the temperature data from computing devices 220, the management application may also be configured to periodically read (and store into a database) environmental data from sensors 140 located inside and outside the data center. The environmental data collected may be tagged with a timestamp and the location information of the sensor or computing device generating the data. While the illustrated examples show the computing devices 220 arranged in two-dimensional arrays that are planar and perpendicular to the floor, other arrangements are possible and contemplated.

Figure 3:
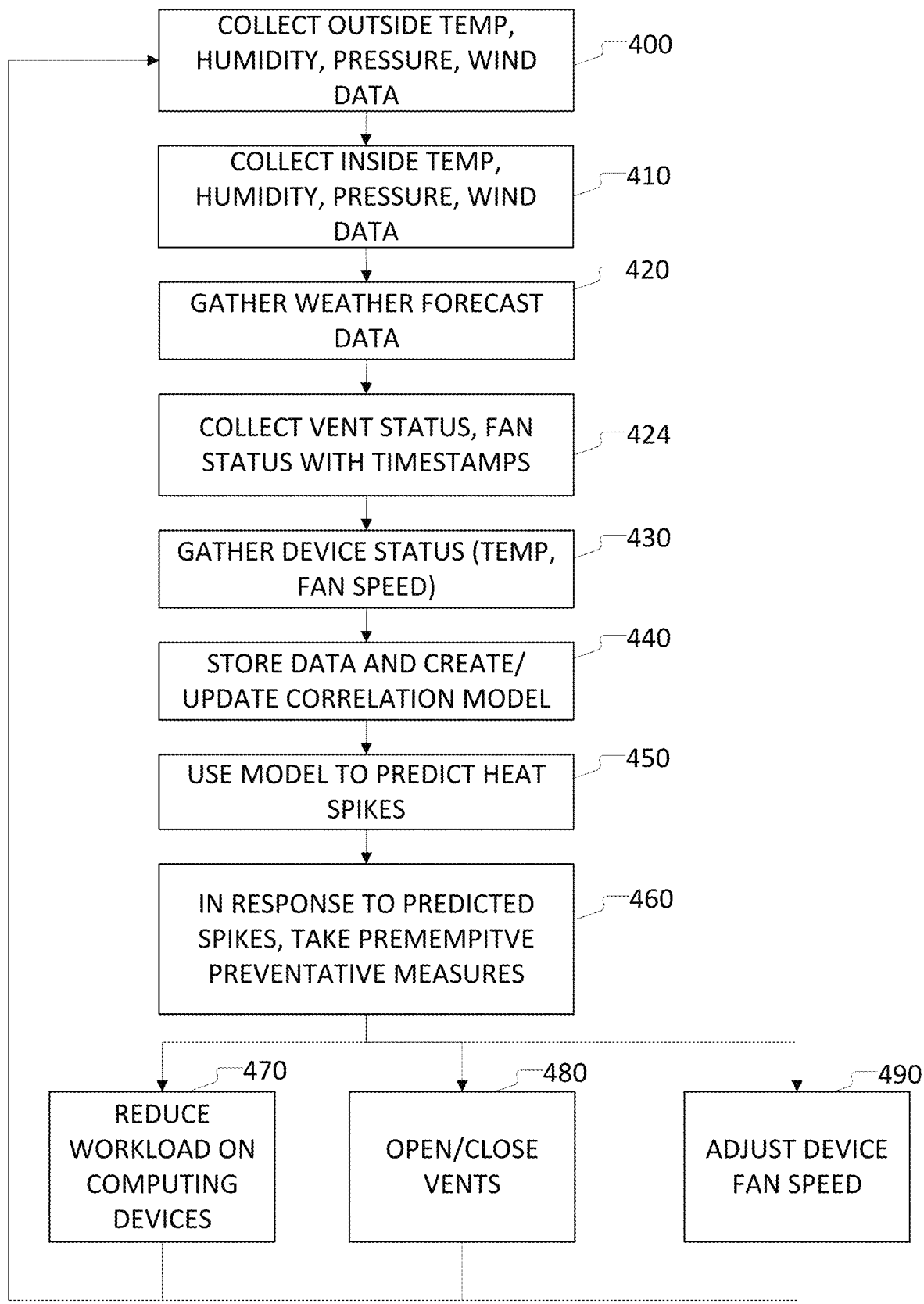
FIG. 3 is a flowchart of a one embodiment of a method for managing computing devices in a data center according to the teachings of the present disclosure.

Turning now to FIG. 3, a flow chart of an example embodiment of a method for cooling computing devices in a data center according to the teachings of the present disclosure is shown. Environmental data from sensors both inside and outside the data center may be collected (step 400) including for example temperature, humidity, barometric pressure, wind speed, solar radiation levels, and wind direction. Environmental data from sensors inside the data center may also be collected (step 410) including for example humidity, barometric pressure, airspeed, and temperature. Weather forecast data for the geographic location of the data center may also be collected, e.g., from a weather web API (step 420), along with data center infrastructure status data such as the position of louvers on the external air vents and the speed of any external air fans (step 424). Device status information including device fan speeds and device temperatures may also be gathered (step 430).

As this information is gathered, it may be stored into a database and used to create (and update over time as additional data is collected) a machine learning-based correlation model (step 440). The correlation model correlates the collected external environmental data and weather forecasts with internal environmental data and device temperature data to form a model that can be used to predict undesirable environmental events (step 450) for the computing devices such as temperatures that are too low or too high and humidity levels that are too low or too high. Given the large number of variables (including for example the workloads being performed by the computing devices, the internal air volume, air flow and mixing of external and internal air inside the data centers, vent configuration, changes in wind speed, external temperature and humidity changes, etc.), a machine-learning based correlation module is likely to provide better prediction and control of internal environments than traditional manual or thermostat controls.

As data is collected over time, the correlation model will continue to improve and better predict when preemptive preventative measures should be taken (step 460), such as reducing the workload on all or a subset of the computing devices (step 470), adjusting one or more of the vents in the data center (step 480), and adjusting device fan speed on all or a subset of the computing devices (step 490). For example, if the temperature sensors indicate significantly hotter temperatures on one side of the data center that are high enough to eventually cause computing devices in pods to reach undesirable temperatures, the vents on the hotter side of the data center may be closed and the vents on the cooler side of the data center may be opened. If the wind is blowing away from the cooler side, the fan speed on the computing devices may be increased (e.g., more for devices farther from the open cooler side vent and less for the devices closer to the cooler side vent) to compensate. Once the outside temperatures even out, those preventative measures may be reversed in order to reduce the wear and tear on the device fans and to reduce the extra energy needed by the increased fan speed.

As the environment data is time-stamped, the correlation model can also factor in the time of day and time of year along with forecasted changes in upcoming weather. For example, if higher temperatures are expected the next day, the interior air may be cooled lower than normally needed the night before the forecasted high temperature. This process of collecting environmental data and making preventative adjustments may be periodically repeated (e.g. every five minutes) in order to react to new environmental data as it is collected.

Figure 4:
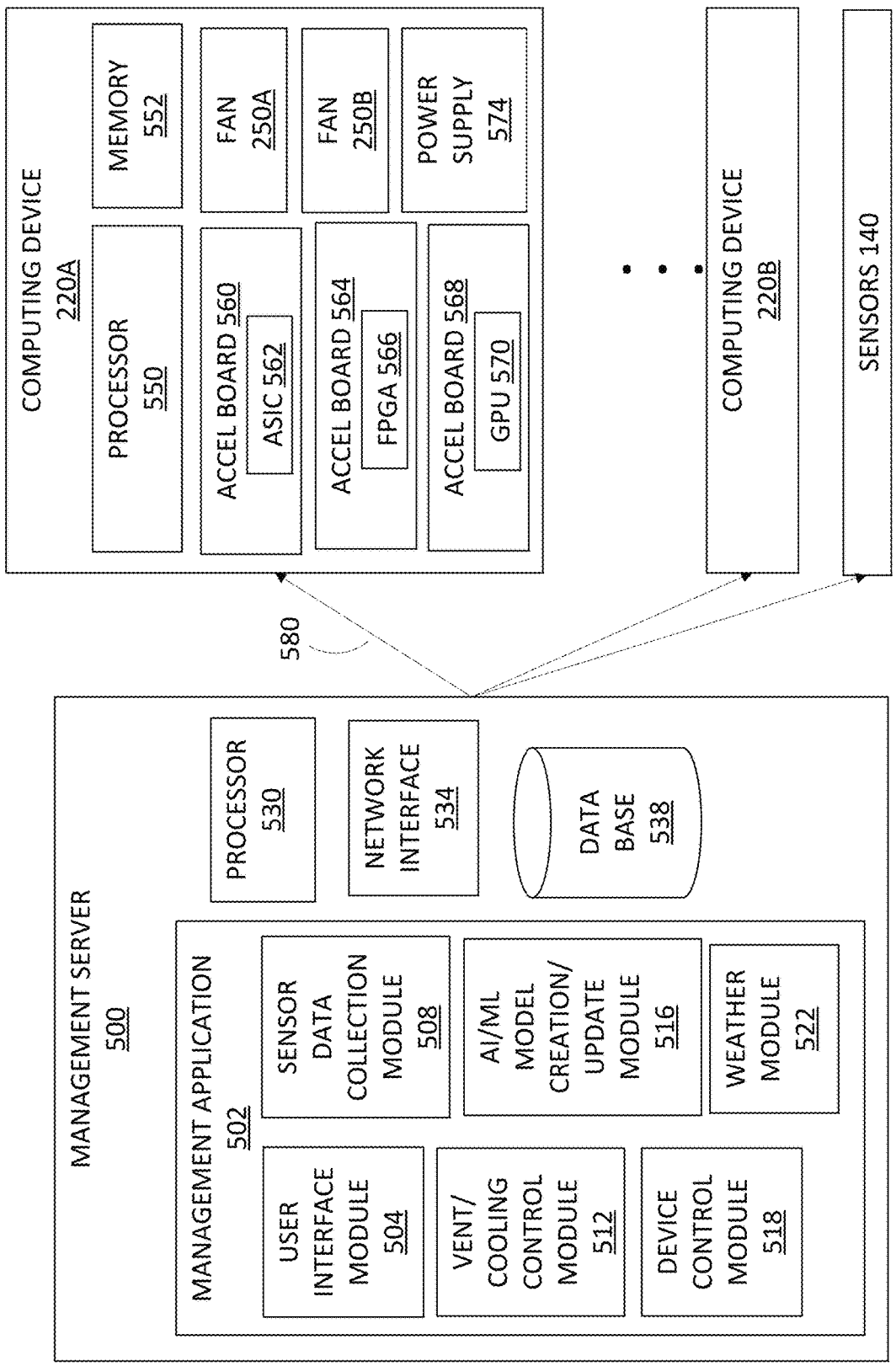
FIG. 4 is a diagram of one embodiment of a system for managing computing devices in a data center according to the teachings of the present disclosure.

Turning now to FIG. 4, a diagram illustrating one example embodiment of a system for managing computing devices in a data center is shown. In this embodiment, computing devices 220A-B may comprise one or more processors 550, memory 552, one or more cooling fans 250A-B, and a power supply 574. Computing devices may also be configured with one or more accelerator boards such as ASIC accelerator board 560 which has one or more ASICs 562, FPGA accelerator board 564 which has one or more FPGAs 566, and GPU accelerator board 568 which has one or more GPUs 570.

In this embodiment, management server 500 is configured to execute a management application 502 using one or more processors 530. The management application 502 is configured with a user interface module 504 that is configured to provide users with controls to configure parameters such as minimum and maximum desired temperature and humidity for computing devices 220A-B. Management application 502 may also be configured with a device control module 518 that is configured to communicate with computing devices 220A-B via network interface 534 and network 580. This may include, for example, reading device temperature information from temperature sensors on the computing device, distributing jobs or computing tasks to the computing devices, and receiving the results of those jobs or tasks. Sensor data collection module 508 may also use network interface 534 to gather environmental status data from sensors 140. In one embodiment, computing devices 220A-B are connected via a wired network connection (e.g., ethernet) to network interface 534, while sensors 140 are connected wirelessly (e.g., Wi-Fi), but other configurations are also possible and contemplated. As noted above, management application 502 may have a vent and cooling control module 512 that is configured to read the status of the vents in data center 100 (e.g., measure how far open or closed the external air vents and internal air mixing vents are) and adjust them as needed. The vents may be controlled for example via ethernet or WiFi. Control module 512 may also be configured to turn on any cooling units used by the data center (e.g., refrigerated air, chilled water, evaporative cooling units, etc.) when needed. Management application 502 may also be configured with a weather module 522 that is configured to gather weather forecast data (e.g., from an internet-based weather service) for the geographic location of the data center.

The data collected by management application 502 may be tagged by location and time stamp and stored into a database 538, which may be located on management server 500 or remotely on another server e.g., on a cloud service provider. This database may then be used by model creation module 516 to create a correlation model that can be used to (i) predict the future impact of changes in environmental variables such as external temperature, humidity, wind speed, pressure and solar radiation measurements along with weather forecasts and (ii) how to mitigate them in the most efficient way.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for managing a plurality of computing devices in a data center, the method comprising:
   periodically collecting outside environmental data from a first array of environmental sensors located outside the data center;
   periodically collecting inside environmental data from a second array of environmental sensors located inside the data center;
   periodically collecting device temperature data from the plurality of computing devices;
   creating a correlation model between the outside environmental data, the inside environmental data, and the device temperature data;
   using the correlation model to predict future heat spikes; and
   in response to a predicted future heat spike, modifying one or more operating parameters,
   wherein the modifying one or more operating parameters comprises closing a first external air intake vent on a first side of the data center and opening a second external air intake vent on a second side of the data center.

2. The method of claim 1, wherein the outside environmental data comprises temperature, humidity, barometric pressure, solar radiation, wind direction and wind speed.

3. The method of claim 1, further comprising periodically updating the correlation model based on newly collected outside environmental data, inside environmental data, and device temperature data.

4. The method of claim 1, further comprising gathering weather forecast data, and using the gathered weather forecast data in the correlation model.

5. The method of claim 1, wherein the modifying further comprises engaging a cooling unit.

6. The method of claim 1, wherein the modifying further comprises adjusting one or more fan speeds of the plurality of at least a subset of the plurality of computing devices.

7. The method of claim 1, further comprising, in response to a predicted future heat spike, reducing an operating frequency of at least a subset of the plurality of computing devices.

8. The method of claim 1, further comprising, in response to a predicted future heat spike, reducing an operating voltage of one or more of the plurality of computing devices.

9. The method of claim 1, further comprising, in response to a predicted future heat spike, reducing a work dispatch frequency for one or more of the plurality of the computing devices.

10. The method of claim 1, wherein the first array of environmental sensors are located on different sides of the data center having different geographic exposures.

11. The method of claim 1, wherein the second array of environmental sensors are located in one or more cold aisles in the data center.

12. The method of claim 1, wherein:
   the first array of environmental sensors located outside the data center includes a first environmental sensor adjacent to the first side of the data center and a second environmental sensor adjacent to the second side of the data center; and
   the modifying one or more operating parameters is based on a condition that a first temperature measured by the first environmental sensor is greater than a second temperature measured by the second environmental sensor.

13. A system for managing a data center, the system comprising:
   a plurality of computing devices located inside the data center;
   a plurality of sensors located outside the data center;
   a management server connected to the plurality of computing devices and sensors via a network, wherein the management server is configured to execute a management application, wherein the management application is configured to:
   create and update a correlation model;
   use the correlation model to predict a future undesirable environmental condition; and
   in response to the predicted future undesirable environmental condition, performing a preventative action,
   wherein the preventative action comprises adjusting external intake vents.

14. The system of claim 13, wherein each computing device comprises one or more fans, wherein the preventative action further comprises temporarily changing a fan speed for at least a subset of the plurality of computing devices.

15. The system of claim 13, wherein the preventative action further comprises temporarily reducing work sent to at least a subset of the plurality of computing devices.

16. The system of claim 13, wherein the adjusting external intake vents comprises closing a first set of intake vents on a first side of the data center and opening a second set of intake vents on a second side of the data center.

17. The system of claim 13, wherein:
   the plurality of sensors located outside the data center includes:
   a first sensor adjacent to a first side of the data center, the first sensor collecting a first temperature, and
   a second sensor adjacent to a second side of the data center, the second sensor collecting a second temperature; and
   the adjusting external intake vents comprises closing a first set of intake vents on the first side of the data center and opening a second set of intake vents on the second side of the data center based on a condition that the first temperature is greater than the second temperature.

18. A non-transitory, computer-readable storage medium storing instructions executable by a processor of a computational device, which when executed cause the computational device to:
- periodically collect environmental data from a first set of sensors located outside a data center;
- periodically collect environmental data from a second set of sensors located inside a data center;
- create a correlation model between the environmental data from the first set of sensors and the environmental data from the second set of sensors;
- predict based on the correlation model an undesirable environmental status for one or more of the computing devices; and
- in response to a predicted undesirable environmental status, adjusting operating parameters for the data center, wherein:
- the operating parameters comprise:
  - opening a first external air intake vent on a first side of the data center; and
  - closing a second external air intake vent on a second side of the data center.

19. The non-transitory, computer-readable storage medium of claim 18, wherein:
- the operating parameters further comprise:
  - decreasing fan speed on a first set of the one or more computing devices closer to the first external air intake vent; and
  - increasing fan speed on a second set of the one or more computing devices closer to the second external air intake vent.

20. The non-transitory, computer-readable storage medium of claim 18, wherein:
- the first set of sensors located outside a data center includes:
  - a first sensor adjacent to the first side of the data center, the first sensor collecting a first temperature, and
  - a second sensor adjacent to the second side of the data center, the second sensor collecting a second temperature; and
- the operating parameters are based on a condition that the second temperature is greater than the first temperature.

* * * * *